United States Patent
Oomori et al.

(10) Patent No.: US 10,741,406 B2
(45) Date of Patent: Aug. 11, 2020

(54) DRY ETCHING METHOD

(71) Applicant: Central Glass Company, Limited, Ube-shi, Yamaguchi (JP)

(72) Inventors: Hiroyuki Oomori, Ube (JP); Akifumi Yao, Ube (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 15/743,534

(22) PCT Filed: Jul. 1, 2016

(86) PCT No.: PCT/JP2016/069569
§ 371 (c)(1),
(2) Date: Jan. 10, 2018

(87) PCT Pub. No.: WO2017/026197
PCT Pub. Date: Feb. 16, 2017

(65) Prior Publication Data
US 2018/0204728 A1    Jul. 19, 2018

(30) Foreign Application Priority Data

Aug. 12, 2015 (JP) .................................. 2015-159517
Sep. 2, 2015 (JP) .................................. 2015-172721

(51) Int. Cl.
*H01L 21/3065* (2006.01)
*H01L 21/306* (2006.01)
(Continued)

(52) U.S. Cl.
CPC .... *H01L 21/3065* (2013.01); *H01L 21/30604* (2013.01); *H01L 21/31* (2013.01);
(Continued)

(58) Field of Classification Search
CPC ........... H01L 21/3065; H01L 21/31116; H01L 21/31; H01L 21/30604; H05H 1/46; H01J 2237/3341
See application file for complete search history.

(56) References Cited

U.S. PATENT DOCUMENTS 5,658,820 A    8/1997  Chung
7,547,635 B2 * 6/2009  Eppler ................ H01L 21/0276
                                                    216/67
(Continued)

FOREIGN PATENT DOCUMENTS

JP    2003-86568 A    3/2003
JP    2008-300616 A    12/2008
(Continued)

OTHER PUBLICATIONS

Wolf and R.N. Tauber, (Silicon Processing for the VLSI Era, vol. 1—Process Technology, Lattice Press, 1986)(pp. 542-557). (Year: 1986).*

(Continued)

*Primary Examiner* — Nadine G Norton
*Assistant Examiner* — Mahmoud Dahimene
(74) *Attorney, Agent, or Firm* — Crowell & Moring LLP

(57) ABSTRACT

Disclosed is a dry etching method for etching a laminated film of silicon oxide layers and silicon nitride layers on a substrate. The dry etching method includes providing a mask on the laminated film, generating a plasma from a dry etching agent and etching the laminated film by the plasma through the mask under a bias voltage of 500 V or higher to form a through hole in the laminated film vertically to the layers, wherein the dry etching agent contains at least $C_3H_2F_4$, an unsaturated perfluorocarbon represented by $C_xF_y$, and an oxidizing gas, and wherein a volume of the unsaturated perfluorocarbon contained in the dry etching agent is 0.1 to 10 times a volume of the $C_3H_2F_4$ contained in the dry etching agent.

19 Claims, 3 Drawing Sheets

(51) Int. Cl.
*H01L 21/311* (2006.01)
*H05H 1/46* (2006.01)
*H01L 21/31* (2006.01)

(52) U.S. Cl.
CPC ......... *H01L 21/31116* (2013.01); *H05H 1/46* (2013.01); *H01J 2237/3341* (2013.01)

(56) References Cited

U.S. PATENT DOCUMENTS

| | | | |
|---|---|---|---|
| 9,865,472 | B2 | 6/2018 | Chebi et al. |
| 2002/0008079 | A1 | 1/2002 | Chung |
| 2005/0103441 | A1 | 5/2005 | Honda et al. |
| 2007/0105295 | A1* | 5/2007 | Kim .................. H01L 29/66537 438/197 |
| 2010/0327413 | A1 | 12/2010 | Lee et al. |
| 2012/0298911 | A1 | 11/2012 | Hibino et al. |
| 2013/0105728 | A1 | 5/2013 | Umezaki et al. |
| 2013/0134492 | A1* | 5/2013 | Yang .................. H01L 27/1157 257/314 |
| 2014/0242803 | A1 | 8/2014 | Hibino et al. |
| 2015/0179466 | A1 | 6/2015 | Takayama et al. |
| 2015/0243521 | A1 | 8/2015 | Ogawa et al. |

FOREIGN PATENT DOCUMENTS

| | | |
|---|---|---|
| JP | 4203996 B2 | 1/2009 |
| JP | 2011-124239 A | 6/2011 |
| JP | 2012-114402 A | 6/2012 |
| JP | 2015-119099 A | 6/2015 |
| JP | 2017-224797 A | 12/2017 |
| KR | 10-2015-0077400 A | 7/2015 |
| TW | I442866 B | 6/2014 |
| TW | I444456 B | 7/2014 |
| TW | I455203 B | 10/2014 |
| WO | WO 2011/093263 A1 | 8/2011 |
| WO | WO 2014/06559 A1 | 5/2014 |
| WO | WO 2014/069559 A1 | 5/2014 |

OTHER PUBLICATIONS

Hideki Aochi et al., "BiCS Flash Memory for Realization of Ultrahigh-Density Nonvolatile Storage Devices," Toshiba Review, Sep. 2011, vol. 66, No. 9, pp. 16-19 with English Abstract.
Jim Handy, "An Alternative Kind of Vertical 3D NAND String," (Online) The Memory Guy (issued on Nov. 8, 2013), Internet <URL:http://thememoryguy.com/an-alternative-kind-of-vertical-3d-nand-string/> (three (3) pages).
Takashi Ichikawa et al., "Topography Simulation Technology for BiCS Ultrahigh-Density Flash Memory," Toshiba Review, May 2011, vol. 66, No. 5, pp. 29-33 with English Abstract.
International Search Report (PCT/ISA/210) issued in PCT Application No. PCT/JP2016/069569 dated Sep. 20, 2016 with English-language translation (Five (5) pages).
Japanese-language Written Opinion (PCT/ISA/237) issued in PCT/JP2016/069569 dated Sep. 20, 2016 (Four (4) pages).
Chinese-language Office Action issued in counterpart Taiwanese Application No. C56947/198272 dated Feb. 26, 2018 with English translation (five (5) pages).
Korean-language Office Action issued in counterpart Korean Application No. 10-2018-7004417 dated Jul. 1, 2019 with English translation (15 pages).

* cited by examiner

DRY ETCHING METHOD

FIELD OF THE INVENTION

The present invention relates to a dry etching method using a dry etching agent containing a fluorine-containing unsaturated hydrocarbon.

BACKGROUND ART

In the manufacturing of semiconductor devices, fine processing is nowadays approaching physical limits. In order to compensate for such limits, it has been proposed to enhance integration of semiconductor devices by stacking structural elements in height directions. This integration tendency is particularly notable in NAND flash memories. The research and development of three-dimensional NAND flash memories are being actively pursued.

For Example, Non-Patent Document 1 discloses a three-dimensional NAND flash memory which includes: a laminated film having a plurality of layers of polycrystalline silicon (hereinafter referred to as "poly-Si" or "p-Si") and layers of silicon oxide (hereinafter referred to as "$SiO_x$") alternately laminated together on a substrate; and structural elements as electrodes embedded in the laminated film vertically to the layers. In the actual manufacturing of this memory device, however, damage is caused to the substrate during etching of the laminated film because both of the underlying substrate and the respective layers of the laminated film are made of Si materials. It is difficult to etch only the laminated film of p-Si and $SiO_x$.

Hence, Non-Patent Document 2 proposes an NAND flash memory using a laminated film of silicon nitride (hereinafter referred to as "SiN") and $SiO_x$ in place of a laminated film of p-Si and $SiO_x$. In one example of manufacturing method of this memory device, an alternate laminated film of SiN layers 1 and $SiO_x$ layers 2 is provided on a substrate 4 as shown in FIG. 1(a) and then subjected to etching to form through holes 5 vertically to the layers as shown in FIG. 1(b). After that, gates are formed by removing the SiN layers although not specifically shown in the figures.

As a method for formation of the through hole in the direction vertical to the layers of the laminated film, Non-Patent Document 3 discloses formation of a through hole in an alternate laminated film of Si and $SiO_2$ by alternately and independently repeating etching of Si and etching of $SiO_2$ during manufacturing of a mass memory called BiCS.

When etching steps are independently performed on the respective layers, however, the number of etching steps significantly increases with increase in the number of layers laminated. When only a conventional CF-based gas is used, the etching rate of SiN is low; and, in some cases, deposition occurs on the SiN layers so that it is not possible to obtain a desired etching shape. Patent Document 1 hence proposes a method for simultaneously etching different kinds of layers in one plasma etching step with the use of a mixed gas containing a CF-based gas and a CHF-based gas.

Furthermore, Patent Document 2 discloses an etching agent containing a fluorine-containing unsaturated hydrocarbon such as HFO-1234ze(E). This etching agent allows high aspect ratio etching because of high etching rate for both SiN and $SiO_2$ and high selectivity to mask material.

PRIOR ART DOCUMENTS

Patent Documents

Patent Document 1: Japanese Laid-Open Patent Publication No. 2003-86568
Patent Document 2: Japanese Laid-Open Patent Publication No. 2012-114402

Non-Patent Documents

Non-Patent Document 1: Hideaki Aochi and two others, Toshiba Review, September 2011, Vol. 66, No. 9, Pages 16-19
Non-Patent Document 2: Jim Handy, "An Alternative Kind of Vertical 3D NAND String" (online); The Memory Guy (issued on Nov. 8, 2013), Internet <URL: http://thememoryguy.com/an-altenative-kind-of-vertical-3d-nand-string/>
Non-Patent Document 3: Takashi Ichikawa and two others, Toshiba Review, May 2011, Vol. 66, No. 5, Pages 29-33

SUMMARY OF THE INVENTION

Problems to be Solved by the Invention

As mentioned above, the method is proposed in which different kinds of layers are simultaneously etched in one plasma etching step with the use of a mixed etching gas containing a CF-based gas and a CHF-based gas as in Patent Document 1. In this method, however, the etching gas does not ensure sufficient etching selectivity to mask. There thus arises a problem that, when the laminated film is large in thickness, the mask cannot persist until completion of the etching step. There also arise a problem of insufficient sidewall protection film formation or abnormal etching shape such as bowing during the etching step.

On the other hand, the etching agent containing 1,3,3,3-tetrafluoropropene, an additive gas and an inert gas shows higher etching selectivity to mask than CF-based gases such as $C_4F_6$ and $C_4F_8$ and can suppress abnormal etching shape such as mask shoulder loss or bowing as disclosed in Patent Document 2.

As is seen from Examples of Patent Document 2, the etching gas containing 1,3,3,3-tetrafluoropropene, additive gas and inert gas shows a SiN etching rate about 1.2 times higher than a $SiO_x$ etching rate. This etching rate characteristic is effective in preventing the above-mentioned problem of abnormal etching shape caused due to low etching rate of the SiN layers in the case of using only the CF-based gas, but can become a cause for another abnormal etching shape during deep etching of the laminated film for the formation of a through hole with a very high aspect ratio of over 20. More specifically, the present inventors have found that, when etching operation is performed with the application of a relatively high power and ion energy in order to attain sufficient etching rate and ion straightness, the etching rate of SiN layer becomes excessively high as compared with the etching rate of $SiO_x$ layer probably because of excessive decomposition of the etching gas such that the etching rate ratio of SiN to $SiO_x$ reaches 2.0 times at the maximum; and etching of the SiN layers proceeds not only anisotropically but also isotropically.

It is known that a Si—N bond of the SiN compound is lower in bond energy than a Si—O bond of the $SiO_x$ compound. For this reason, etching of $SiO_x$ could hardly proceed unless $SiO_x$ is not in a state of increased ion energy under the application of a bias voltage. By contrast, etching of SiN could relatively easily proceed even without the application of a bias voltage in the case of using an etching gas containing H and F atoms. It is thus assumed that, during the above high aspect ratio etching process, SiN is etched selectively and horizontally isotropically. Further, there is a case where the SiN layer exists over the SiO$_x$ layer depending on the structure. In such a case, the rate of horizontal etching of the SiN layer becomes higher than the rate of vertical etching of the SiO$_x$ layer. Consequently, excessive horizontal etching of the SiN layer occurs as shown in FIG. 2.

The mechanism for the occurrence of excessive horizontal etching of the SiN layer is assumed as follows. During normal etching process, an active species having the potential of isotropically and anisotropically etching SiN is present in the hole. In the presence of such an active species with ions accelerated under a bias voltage, SiN dominantly undergoes anisotropic etching in addition to isotropic etching. In the case where the underlying SiO$_x$ layer is exposed via the hole, however, SiN does not exist vertically to the SiO$_x$ layer in the hole so that all of the species active to SiN contributes to horizontal isotropic etching without contributing to anisotropic etching. In consequence, horizontal isotropic etching of the SiN layer proceeds acceleratedly as compared with the case where the underlying SiN layer is exposed via the hole passing through the SiO$_x$ layer.

The occurrence of excessive horizontal etching of the SiN layer can lead to the formation of an unexpected void in the laminated structure, which result in collapse of the laminated structure. It has thus been required to suppress excessive horizontal etching of the SiN layer by lowering the ratio of the etching rate of SiN to the etching rate of SiO$_x$ (SiN/SiO$_x$ ratio). More specifically, there has been a demand to establish a method of freely controlling the ratio of the etching rate of SiN to the etching rate of SiO$_x$ (SiN/SiO$_x$ ratio) within the range from 0.90 to 1.5.

Patent Document 2 discloses a method for selectively etching SiN or SiO$_x$, but does not mention any specific method of freely controlling the etching grade of SiN and SiO$_x$.

The present invention has been made in view of the above problems. It is an object of the present invention to provide a method of plasma etching a laminated film of SiO$_x$ and SiN through a mask with the use of 1,3,3,3-tetrafluoropropene as an etching gas so as to freely control the ratio of the etching rate of SiN to the etching rate of SiO$_x$ (SiN/SiO$_x$ ratio) within the range from 0.90 to 1.5 and to attain high selectivity to the mask.

Means for Solving the Problems

As a result of extensive researches made to achieve the above object, the present inventors have found that, at the time of formation of a through hole in a laminate of SiN layers and SiO$_x$ layers on a substrate in a direction vertical to the layers, it is possible to freely control the ratio of the etching rate of SiN to the etching rate of SiO$_x$ (SiN/SiO$_x$ ratio) within the range from 0.90 to less than 1.5 and to attain high etching selectivity to mask by performing plasma etching with the use of a dry etching agent containing at least 1,3,3,3-tetrafluoropropene and a C$_2$-C$_5$ unsaturated perfluorocarbon at a predetermined ratio. The present invention is based on such a finding.

Namely, the present invention provides a dry etching method for etching a laminated film of silicon oxide layers and silicon nitride layers on a substrate, the dry etching method comprising providing a mask with a predetermined opening pattern on the laminated film, generating a plasma from a dry etching agent and etching the laminated film by the plasma through the mask under a bias voltage of 500 V or higher to form a through hole in the laminated film in a direction vertical to the silicon oxide layers and the silicon nitride layers, wherein the dry etching agent contains at least C$_3$H$_2$F$_4$, an unsaturated perfluorocarbon represented by C$_x$F$_y$ (where x is an integer of 2 to 5; y is 2, 4, 6, 8 or 10; and x and y satisfy y≤2x) and an oxidizing gas, and wherein a volume of the unsaturated perfluorocarbon contained in the dry etching agent is 0.1 to 10 times a volume of the C$_3$H$_2$F$_4$ contained in the dry etching agent.

It is preferable that the unsaturated perfluorocarbon is at least one selected from the group consisting of C$_3$F$_6$, C$_4$F$_6$, C$_4$F$_8$ and C$_5$F$_8$. It is also preferable that a total concentration of the unsaturated perfluorocarbon and the C$_3$H$_2$F$_4$ in the dry etching agent is 5 vol % or more.

The dry etching agent may consist only of the C$_3$H$_2$F$_4$, the unsaturated perfluorocarbon, the oxidizing gas and an inert gas.

Further, it is preferable that the C$_3$H$_2$F$_4$ is 1,3,3,3-tetrafluoropropene.

The present invention enables etching of a laminated structure of SiN layers and SiO$_x$ layers on a substrate for the formation of a through hole in the laminated film in a direction vertical to the layers during manufacturing of a three-dimensional NAND flash memory etc., so as to freely control the ratio of the etching rate of SiN to the etching rate of SiO$_x$ (SiN/SiO$_x$ ratio) within the range of 0.90 to less than 1.5 and to attain high selectivity to mask. It is therefore possible to suppress excessive isotropic etching of portions of the SiN layers exposed inside the through hole of the laminated film and, even in the case of forming the through hole by etching with an aspect ratio over 20, prevent collapse of the laminated structure.

DETAILED DESCRIPTION OF EMBODIMENTS

Hereinafter, embodiments of the present invention will be described bellows. It should be understood that: the scope of the present invention is not limited to the following embodiments; and various changes and modifications of the following embodiments can be made as appropriate within the range that does not impair the effects of the present invention.

Figure 1A:
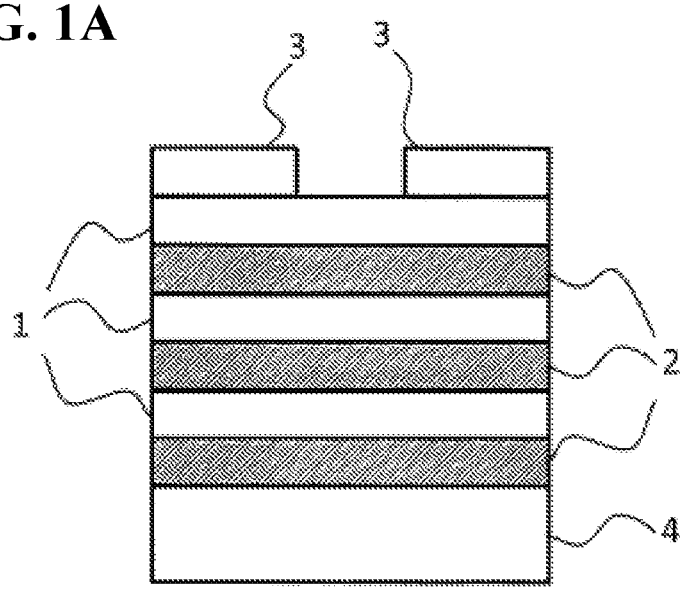
FIGS. 1A and 1B are schematic views showing a laminated structure of a device before and after the formation of a through hole.
Figure 1B:
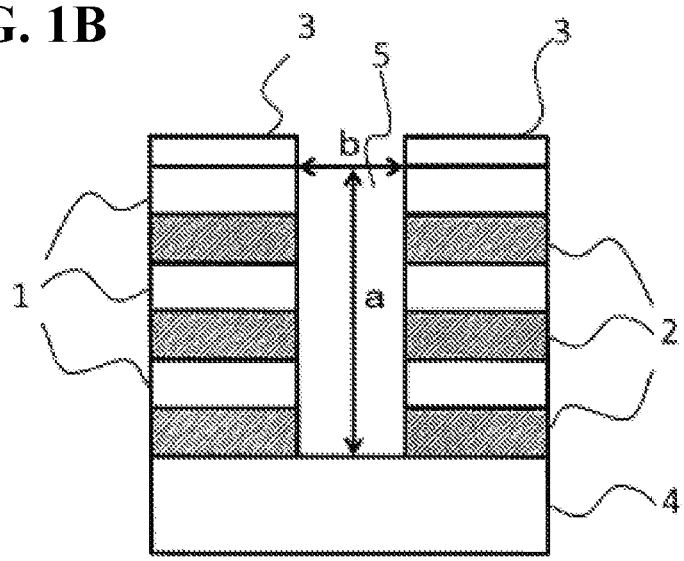
Figure 2:
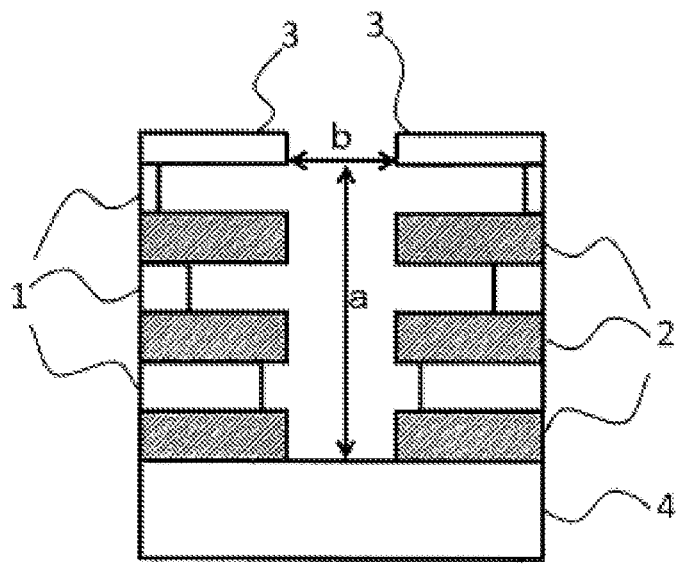
FIG. 2 is a schematic view showing unexpected isotropic etching of SiN during etching operation.

In a dry etching method according to the present invention, an alternate laminated film of SiN layers 1 and SiO$_x$ layers 2 is provided in advance, on a substrate 4, with a mask 3 having a predetermined opening pattern as shown in FIG. 1(*a*). Then, etching operation is performed on the laminated film through the mask 3 so as to form a through hole 5 in the laminated film in a direction vertical to the layers, i.e., in a direction vertical to the substrate 4 as shown in FIG. 1(*b*). For practical use, the alternate laminated film has 32 layers, 48 layers or more layers laminated together. The through hole 5 is accordingly in the form of a very narrow hole with an aspect ratio of 20 or higher. (The aspect ratio is a value obtained by dividing a thickness a of the alternate laminated film by an opening width b of the mask 3.)

The dry etching method according to the present invention is characterized in that the laminated film of $SiO_x$ layers and SiN layers on the substrate is etched by plasma etching with the use of a dry etching agent containing at least $C_3H_2F_4$, an unsaturated perfluorocarbon represented by $C_xF_y$ (where x is an integer of 2 to 5; y is 2, 4, 6, 8 or 10; and x and y satisfy y≤2x) and an oxidizing gas with a mixing ratio of $C_3H_2F_4$ and the unsaturated perfluorocarbon being 1:0.1 to 10 in terms of volume ratio. There is no particular limitation on the substrate used. For example, a silicon wafer can be used as the substrate. As the material of the mask 3, there can be used amorphous carbon.

The unsaturated perfluorocarbon represented by $C_xF_y$ has one or more double bonds or triple bonds and can be linear or cyclic. There may exist structural isomers or stereoisomers (trans (E) isomer and cis (Z) isomer) of the unsaturated perfluorocarbon represented by $C_xF_y$. In the present invention, it is feasible to use either one of the isomers or a mixture of the isomers. As $C_2F_4$, tetrafluoroethylene is usable. As $C_3F_6$, hexafluoropropene is usable. Examples of $C_4F_6$ usable include hexafluoro-1,3-butadiene, hexafluoro-2-butyne and hexafluorocyclobutene. Examples of $C_4F_8$ usable include octafluoro-2-butene, octafluoro-1-butene and octafluoroisobutene. Examples of $C_5F_8$ usable include octafluoro-1,4-pentadiene and octafluorocyclopentene. As $C_5F_{10}$, decafluoro-1-pentene is usable.

The unsaturated perfluorocarbon represented by $C_xF_y$ has one or more double bonds or triple bonds and can be linear or cyclic. There may exist structural isomers or stereoisomers (trans (E) isomer and cis (Z) isomer) of the unsaturated perfluorocarbon represented by $C_xF_y$. In the present invention, it is feasible to use either one of the isomers or a mixture of the isomers. As $C_2F_4$, tetrafluoroethylene is usable. As $C_3F_6$, hexafluoropropane is usable. Examples of $C_4F_6$ usable include hexafluoro-1,3-butadiene, hexafluoro-2-butyne and hexafluorocyclobutene. Examples of $C_4F_8$ usable include octafluoro-2-butene, octafluoro-1-butene and octafluoroisobutene. Examples of $C_5F_8$ usable include octafluoro-1,4-pentadiene and octafluorocyclopentene. As $C_5F_{10}$, decafluoro-1,4-pentene is usable.

As $C_3H_2F_4$, there can be used any of 2,3,3,3-tetrafluoropropene (HFO-1234yf), trans-1,3,3,3-tetrafluoropropene (HFO-1234ze(E)) and cis-1,3,3,3-tetrafluoropropene (HFO-1234ze(Z)). It is particularly preferable to use a trans isomer and/or a cis isomer of 1,3,3,3-tetrafluoropropene.

The unsaturated perfluorocarbon represented by $C_xF_y$, which has an unsaturated bond in the molecule, is polymerized in a plasma and deposited so as to form a protection film on a side wall of the through hole. It is thus possible to suppress isotropic etching of SiN by the addition of the unsaturated perfluorocarbon although, when $C_3H_2F_4$ is used solely, isotropic etching of SiN proceeds.

In order to achieve adequate etching grade, the concentration of $C_3H_2F_4$ is preferably 1 vol % or higher, more preferably 5 vol % or more, relative to the total flow rate of the dry etching agent including the after-mentioned oxidizing gas and inert gas in addition to $C_3H_2F_4$ and $C_xF_y$. Further, the total concentration of $C_3H_2F_4$ and $C_xF_y$ in the dry etching agent is preferably 5 vol % or more relative to the total flow rate of the dry etching agent. In terms of cost effectiveness, on the other hand, it is not favorable that the total concentration of $C_3H_2F_4$ and $C_xF_y$ exceeds 50 vol % relative to the total flow rate of the dry etching agent because it is not possible to ensure the sufficient proportion of the oxidizing gas and not possible to improve the etching grade considering that the expensive fluorine-containing unsaturated hydrocarbons are used in a large amount.

The mixing ratio of $C_3H_2F_4$ and the unsaturated perfluorocarbon represented by $C_xF_y$ is preferably 1:0.1 to 10, more preferably 1:0.2 to 1.0, still more preferably 1:0.4 to 0.7, in terms of volume ratio. When the unsaturated perfluorocarbon represented by $C_xF_y$ is used in too large amount, it may not be possible to obtain a desired etching shape due to considerable decrease in the vertical anisotropic etching rate of the SiN layer.

The unsaturated perfluorocarbon represented by $C_xF_y$, which has a double or triple bond in the molecule, is polymerized in a plasma so as to also form a protection film on the mask of resist. It is thus possible to attain sufficient selectivity to resist by the addition of the unsaturated perfluorocarbon. In the case of using a saturated perfluorocarbon, the ratio of the etching rate of SiN to the etching rate of $SiO_x$ ($SiN/SiO_x$ ratio) can be slightly controlled but cannot be controlled to a sufficient degree. Further, it is not possible to ensure etching selectivity to the mask in the case of using a saturated perfluorocarbon. Such a saturated perfluorocarbon etching gas is thus not suitable for etching with a very high aspect ratio exceeding 20.

In the present invention, the etching rate of the SiN layer and the $SiO_x$ layer can be freely controlled whereby it is possible to etch the SiN layers and the $SiO_x$ layers in one operation step. Since the etching rate of the SiN layer is equivalent to the etching rate of the $SiO_x$ layer, the through hole can be formed in the laminated film with less unevenness on the wall (inner surface) of the through hole and with uniformity in diameter between the upper and lower parts of the through hole.

The oxidizing gas is contained in the dry etching agent. As the oxidizing gas, there can be used $O_2$, $O_3$, CO, $CO_2$, $COCl_2$, $COF_2$, $NO_2$ or the like. For ease of availability and handling, it is preferable to use oxygen gas. The amount of the oxidizing gas contained is preferably 1 to 50 vol %, more preferably 2 to 30 vol %, still more preferably 5 to 10 vol %, based on the total amount of the dry etching agent.

Further, the inert gas is preferably added to the dry etching agent for the purpose of improving handling safety while reducing cost. As the inert gas, there can be used noble gas such gas argon gas, helium gas, neon gas or krypton gas, or nitrogen gas. It is particularly preferable to use argon gas for ease of availability as well as ion assist effect expected from argon gas. The dry etching agent may consist only of $C_3H_2F_4$, the unsaturated perfluorocarbon represented by $C_xF_y$, the oxidizing gas and the inert gas.

Any known gas may be further added to the dry etching agent. As such an additive gas, there can be used a saturated fluorocarbon represented by $C_lH_mF_n$ (where l is an integer of 1 to 5; m and n are each a positive integer; and l, m and n satisfy m+n=2l or 2l+2), a hydrocarbon gas, a halogen-containing gas, a reducing gas or the like. Examples of the saturated fluorocarbon represented by $C_lH_mF_n$ include $CHF_3$, $CH_2F_2$, $CH_3F$, $C_2H_2F_4$, $C_2HF_5$, $C_3HF_7$, $C_3H_2F_6$, $C_3H_3F_5$, $C_3H_4F_4$, $C_3H_5F_3$ and $C_4HF_9$. Examples of the hydrocarbon gas include $CH_4$, $C_2H_2$, $C_2H_4$, $C_2H_6$, $C_3H_4$, $C_3H_6$ and $C_3H_8$. Examples of the halogen-containing gas include $F_2$, $Cl_2$, $Br_2$, $I_2$, $YF_n$ (where Y is Cl, Br or I; and n is an integer of 1 to 7), $NF_3$, HF, HCl, HBr and HI. Examples of the reducing gas include $H_2$, $NH_3$ and NO. The dry etching agent may consist only of $C_3H_2F_4$, the unsaturated perfluorocarbon represented by $C_xF_y$, the oxidizing gas, the inert gas and the above additive gas.

In order to perform etching with high straightness in the direction vertical to the layers, it is necessary to set a bias voltage of 500 V or higher. The bias voltage applied is preferably 1000V or higher. It is possible to reduce side etching by increasing the bias voltage. It is however not favorable that the bias voltage exceeds 10000 V because such a high bias voltage cause a large damage on the substrate.

The gas components of the etching gas may be introduced independently into a chamber or may be mixed together and introduced as a mixed gas into a chamber. The total flow rate of the dry etching agent introduced into the reaction chamber is set as appropriate depending on the capacity of the reaction chamber and the exhaust performance of exhaust system in view of the above-mentioned concentration conditions and pressure conditions.

The pressure inside the chamber during the etching operation is preferably 10 Pa or lower, more preferably 5 Pa or lower, in order to generate a stable plasma and improve ion straightness for suppression of side etching. When the pressure inside the chamber during the etching operation becomes too low, on the other hand, it is not possible to obtain a sufficient plasma density due to decrease in the amount of dissociated ions. The pressure inside the chamber during the etching operation is thus preferably 0.05 Pa or higher.

Further, the temperature of the substrate during the etching operation is preferably 50° C. or lower. For anisotropic etching, the temperature of the substrate during the etching operation is particularly preferably 20° C. or lower. Under high-temperature conditions exceeding 50° C., the tendency of isotropic etching increases with decrease in the amount of the protection film formed mainly from fluorocarbon radicals on the side wall of the through hole so that it is not possible to obtain a required level of processing accuracy. In addition, there may occur considerable etching of the mask material such as resist under such high-temperature conditions.

The etching time is preferably 30 minutes or less in view of device manufacturing efficiency. Herein, the etching time refers to a time of reaction of the sample by plasmarization of the dry etching agent in the chamber.

There are no particular limitations on the number of the layers of the laminated film and the depth of the through hole. In order to ensure the effect of integration by layer lamination, it is preferable that the total number of the SiN and $SiO_x$ layers is 6 or more; and the depth of the through hole is 0.5 μm or more.

The dry etching method using the dry etching agent according to the present invention can be executed by various etching techniques, such as capacitive coupling plasma (CCP) etching, reactive ion etching (RIE), inductively coupled plasma (ICP) etching, electron cyclotron resonance (ECR) plasma etching and microwave etching, without particular limitations.

During the etching operation for the formation of the through hole in the laminated film of SiN and $SiO_x$ layers, the composition ratio of $C_3H_2F_4$ and $C_xF_y$ in the dry etching agent is not necessarily fixed at a constant value and can be changed stepwise or periodically. When the amount of $C_xF_y$ is decreased, SiN can be etched at a high rate. On the other hand, horizontal etching of SiN can be suppressed when the amount of $C_xF_y$ is increased. The etching rate of SiN is however decreased with increase in the amount of $C_xF_y$. It is thus possible to achieve both shortening of the time required for the formation of the through hole and suppression of horizontal etching of SiN by appropriately changing the amount of $C_xF_y$ during the etching operation For example, the amount of the unsaturated perfluorocarbon in the dry etching agent may be set larger in the latter half of the formation of the though hole than in the former half of the formation of the though hole because the influence of horizontal etching on the SiN layers of the upper part of the side wall of the through hole becomes large during the latter half of the formation of the through hole. Alternatively, the amount of the unsaturated perfluorocarbon in the dry etching agent may be decreased to increase the etching rate during etching of the SiN layers of the laminated film; and the amount of the unsaturated perfluorocarbon in the dry etching agent may be increased during etching of the $SiO_x$ layers of the laminated film so as to suppress horizontal etching of the SiN layers.

During the formation of the through hole, dry etching operation may be performed with the use of a dry etching agent not containing $C_xF_y$, i.e., with the use of a dry etching agent containing $C_3H_2F_4$ and the oxidizing gas and substantially free of $C_xF_y$. In general, the amount of $C_xF_y$ contained as an impurity in an etching gas of $C_3H_2F_4$ is 0.1 volume % or less. Namely, the dry etching agent containing $C_3H_2F_4$ and the oxidizing gas and substantially free of $C_xF_y$ has a $C_xF_y$ content of generally 0.1 volume % or less.

For example, it is one embodiment to: perform a first dry etching step with the use of a first dry etching agent containing $C_3H_2F_4$ and the oxidizing gas and substantially free substantially free of $C_xF_y$ during the former half of the formation of the through hole, i.e., during etching of about half of the laminated film (e.g. ½ to ⅝ of the thickness of the laminated film); and perform a second dry etching step with the use of a second dry etching agent containing $C_3H_2F_4$, the oxidizing gas and $C_xF_y$ after etching about half of the laminated film. In this method, the first dry etching step allows high-rate etching of SiN during the initial stage of formation of the through hole where horizontal etching of SiN is unlikely to occur; and the second dry etching step allows etching of the laminated film while suppressing horizontal etching of SiN with the addition of $C_xF_y$ to the dry etching agent during the final stage of formation of the through hole where horizontal etching of SiN becomes a problem. Namely, it is possible to shorten the time required for the formation of the through hole while suppressing horizontal etching of the SiN layers.

It is another embodiment to: perforce a first etching step of etching the SiN layers of the laminated film without the addition of $C_xF_y$ to the dry etching agent and perform a second etching step of etching the $SiO_x$ layers of the laminated film with the use of the dry etching agent according to the present invention. In this method, the $SiO_x$ layers are etched during the second etching step in which horizontal etching of the SiN layer can be suppressed; and the SiN layers are etched by the dry etching agent of high SiN etching rate without adding $C_xF_y$ during the first etching step. Although it is necessary to change the dry etching agent supplied according to the number of lamination of the SiN layers and the $SiO_x$ layers, the dry etching agent can be changed by switching on or off the supply of $C_xF_y$. As there is no need to conduct great work for switching between the etching steps of the respective layers, the etching process is not so complicated. In Non-Patent Document 3, by contrast, halogen gas and fluorocarbon-based gas are used for etching of the Si layers and the $SiO_2$ layers so that the etching process is complicated and time-consuming because of the need to evacuate the chamber for switching between the etching steps of the respective layers.

It is possible by the etching method according to the present invention to freely control the ratio of the etching rate of SiN to the etching rate of $SiO_x$ ($SiN/SiO_x$ ratio) within the range from 0.90 to less than 1.5 and to attain high selectivity to the mask. Therefore, the etching method according to the present invention is suitably applicable to the formation of a through hole with an aspect ratio of over 20 in an alternate laminated film of SiN and $SiO_x$ during manufacturing of a three-dimensional NAND flash memory.

After the formation of the though hole in the laminated film of SiN and $SiO_x$ layers by the etching method according to the present invention, ashing treatment may be performed by means of a plasma generated from an oxygen-containing processing gas so as to remove a reactive product generated from the deposit of $C_xF_y$ etc. on the side wall of the through hole as well as to remove the mask.

EXAMPLES

The present invention will be described in more detail below by way of the following examples. It should however be noted that the following examples are illustrative and are not intended to limit the present invention thereto.

Example 1

(Etching Operation)

Figure 3:
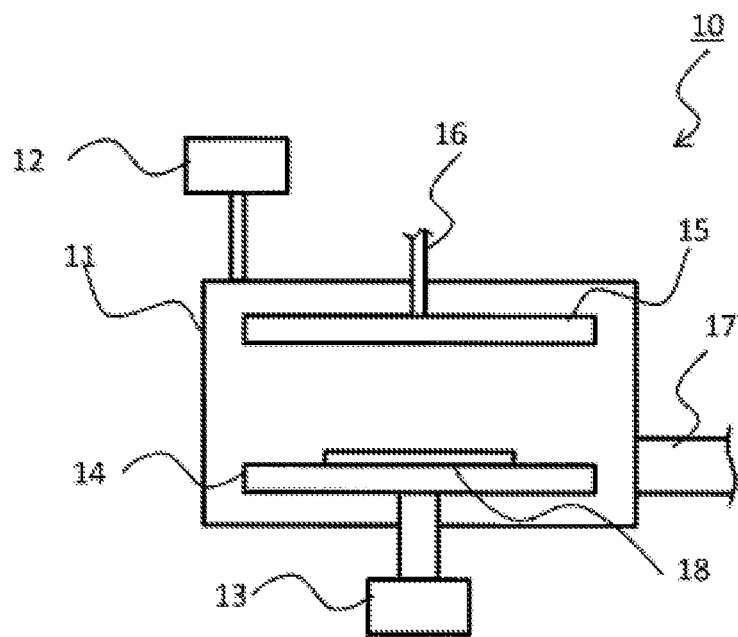
FIG. 3 is a schematic view showing a reaction apparatus used in Examples and Comparative Examples.

FIG. 3 is a schematic view of a reaction apparatus 10 used in Examples and Comparative Examples. A lower electrode 14, an upper electrode 15 and a pressure gauge 12 are arranged in a chamber 11. Herein, the lower electrode 14 had the function of holding a sample 18 and thus also served as a stage. A gas introduction hole 16 was connected to an upper part of the chamber 11. Further, the chamber 11 was adapted to control its inside pressure and to excite a dry etching agent by means of a high-frequency power source (13.56 MHz) 13. Etching operation was performed by bringing the excited dry etching agent into contact with the sample 18 on the lower electrode 14. With the application of a high-frequency power from the high-frequency power source 13 in a state where the dry etching agent was introduced into the chamber, there was developed a direct-current voltage, called a bias voltage, between the upper electrode 15 and the lower electrode 14 due to a difference between the drift speed of ions and the drift speed of electrons in the plasma. The gas inside the chamber 11 was discharged via an exhaust line 17.

As the sample 18, a silicon wafer A with a SiN layer and a silicon wafer B with a $SiO_2$ layer were placed on the stage. Each of the SiN layer and the $SiO_2$ layer was formed by CVD process.

To the sample, an etching agent was supplied at a total flow rate of 100 sccm by mixing $C_3H_2F_4$(HFO-1234ze(E)), $C_3F_6$, $O_2$ and Ar at a ratio of 10 volume %, 1 volume %, 6 volume % and 83 volume % relative to the total flow rate. The etching agent was excited to a plasma with the application of a high-frequency power of 400 W. The sample was subjected to etching operation by the plasma under a bias voltage of 500 V.

The etching rate of the SiN layer on the silicon wafer A and the etching rate of the $SiO_2$ layer on the silicon wafer B were each determined based on a difference in the thickness of the layer before and after the etching operation.

Example 2

Etching operation was performed in the same manner as in Example 1, except that the etching agent was supplied by mixing $C_3H_2F_4$ (HFO-1234ze(E)), $C_3F_6$ (hexafluoropropene), $O_2$ and Ar at a ratio of 10 volume %, 3 volume %, 6 volume % and 81 volume % relative to the total flow rate.

Example 3

Etching operation was performed in the same manner as in Example 1, except that the etching agent was supplied by mixing $C_3H_2F_4$(HFO-1234ze(E)), $C_3F_6$, $O_2$ and Ar at a ratio of 10 volume %, 5 volume %, 6 volume % and 79 volume % relative to the total flow rate.

Example 4

Etching operation was performed in the same manner as in Example 1, except that the etching agent was supplied by mixing $C_3H_2F_4$(HFO-1234ze(E)), c-$C_5F_8$ (octafluorocyclopentene), $O_2$ and Ar at a ratio of 10 volume %, 1 volume %, 6 volume % and 83 volume % relative to the total flow rate.

Example 5

Etching operation was performed in the same manner as in Example 1, except that the etching agent was supplied by mixing $C_3H_2F_4$(HFO-1234ze(E)), c-$C_5F_8$, $O_2$ and Ar at a ratio of 10 volume %, 3 volume %, 9 volume % and 78 volume % relative to the total flow rate.

Example 6

Etching operation was performed in the same manner as in Example 1, except that the etching agent was supplied by mixing $C_3H_2F_4$(HFO-1234ze(E)), $C_4F_6$ (hexafluoro-1,3-butadiene), $O_2$ and Ar at a ratio of 10 volume %, 1 volume %, 6 volume % and 83 volume % relative to the total flow rate.

Example 7

Etching operation was performed in the same manner as in Example 1, except that the etching agent was supplied by mixing $C_3H_2F_4$(HFO-1234ze(E)), $C_4F_6$, $O_2$ and Ar at a ratio of 10 volume %, 3 volume %, 9 volume % and 78 volume % relative to the total flow rate.

Example 8

Etching operation was performed in the same manner as in Example 1, except that the etching agent was supplied by mixing $C_3H_2F_4$(HFO-1234ze(E)), $C_4F_6$, $O_2$ and Ar at a ratio of 5 volume %, 10 volume %, 6 volume % and 79 volume % relative to the total flow rate.

Comparative Example 1

Etching operation was performed in the same manner as in Example 1, except that the etching agent was supplied by mixing $C_3H_2F_4$(HFO-1234ze(E)), $O_2$ and Ar at a ratio of 10 volume %, 6 volume % and 84 volume % relative to the total flow rate with the addition of no unsaturated perfluorocarbon.

Comparative Example 2

Etching operation was performed in the same manner as in Example 1, except that the etching agent was supplied by mixing $C_3H_2F_4$ (HFO-1234ze(E)), c-$C_4F_8$ (octafluorocyclobutane), $O_2$ and Ar at a ratio of 10 volume %, 3 volume %, 9 volume % and 78 volume % relative to the total flow rate.

Comparative Example 3

Etching operation was performed in the same manner as in Example 1, except that the etching agent was supplied by mixing $C_3H_2F_4$(HFO-1234ze(E)), $C_2F_6$ (hexafluoroethane), $O_2$ and Ar at a ratio of 10 volume %, 3 volume %, 9 volume % and 78 volume % relative to the total flow rate.

Comparative Example 4

Etching operation was performed in the same manner as in Example 1, except that the etching agent was supplied by mixing $C_3H_2F_4$ (HFO-1234ze(E)), $C_3F_8$ (octafluoropropane), $O_2$ and Ar at a ratio of 10 volume %, 3 volume %, 9 volume % and 78 volume % relative to the total flow rate.

Comparative Example 5

Etching operation was performed in the same manner as in Example 1, except that the etching agent was supplied by mixing $C_3H_2F_4$(HFO-1234ze(E)), $C_3F_6$, $O_2$ and Ar at a ratio of 1 volume %, 11 volume %, 6 volume % and 82 volume % relative to the total flow rate.

Comparative Example 6

Etching operation was performed in the same manner as in Example 1, except that the etching agent was supplied by mixing $C_3F_6$, $O_2$ and Ar at a ratio of 10 volume %, 6 volume % and 84 volume % relative to the total flow rate.

Comparative Example 7

Etching operation was performed in the same manner as in Example 1, except that the etching agent was supplied by mixing $C_3H_2F_4$(HFO-1234ze(E)), TFPy (3,3,3-trifluoropropyne), $O_2$ and Ar at a ratio of 10 volume %, 3 volume %, 9 volume % and 78 volume % relative to the total flow rate. The results of Examples and Comparative Examples are shown in TABLE 1. In TABLE 1, the etching rate ratio refers to the ratio of the etching rate of $SiO_x$ to the etching rate of SiN (SiN/$SiO_x$ ratio); and the etching selectivity ratio refers to the ratio of the etching rate of $SiO_x$ to the etching rate of the resist ($SiO_x$/resist ratio).

TABLE 1

| | Main etching gas | | Additive gas | | Oxidizing gas | | Inert gas | | Pressure [Pa] |
|---|---|---|---|---|---|---|---|---|---|
| | Kind | Conc. [vol %] | Kind | Conc. [vol %] | Kind | Conc. [vol %] | Kind | Conc. [vol %] | |
| Ex. 1 | $C_3F_4H_2$ | 10 | $C_3F_6$ | 1 | $O_2$ | 6 | Ar | 83 | 1 |
| Ex. 2 | $C_3F_4H_2$ | 10 | $C_3F_6$ | 3 | $O_2$ | 6 | Ar | 81 | 1 |
| Ex. 3 | $C_3F_4H_2$ | 10 | $C_3F_6$ | 5 | $O_2$ | 6 | Ar | 79 | 1 |
| Ex. 4 | $C_3F_4H_2$ | 10 | c-$C_5F_8$ | 1 | $O_2$ | 6 | Ar | 83 | 1 |
| Ex. 5 | $C_3F_4H_2$ | 10 | c-$C_5F_8$ | 3 | $O_2$ | 9 | Ar | 78 | 1 |
| Ex. 6 | $C_3F_4H_2$ | 10 | $C_4F_6$ | 1 | $O_2$ | 6 | Ar | 83 | 1 |
| Ex. 7 | $C_3F_4H_2$ | 10 | $C_4F_6$ | 3 | $O_2$ | 9 | Ar | 78 | 1 |
| Ex. 8 | $C_3F_4H_2$ | 5 | $C_4F_6$ | 10 | $O_2$ | 6 | Ar | 79 | 1 |
| Comp Ex. 1 | $C_3F_4H_2$ | 10 | No addition | | $O_2$ | 6 | Ar | 84 | 1 |
| Comp. Ex. 2 | $C_3F_4H_2$ | 10 | c-$C_4F_8$ | 3 | $O_2$ | 9 | Ar | 78 | 1 |
| Comp. Ex. 3 | $C_3F_4H_2$ | 10 | $C_2F_6$ | 3 | $O_2$ | 9 | Ar | 78 | 1 |
| Comp. Ex. 4 | $C_3F_4H_2$ | 10 | $C_3F_8$ | 3 | $O_2$ | 9 | Ar | 78 | 1 |
| Comp Ex. 5 | $C_3F_4H_2$ | 1 | $C_3F_6$ | 11 | $O_2$ | 6 | Ar | 82 | 1 |
| Comp. Ex. 6 | No addition | | $C_3F_6$ | 10 | $O_2$ | 6 | Ar | 84 | 1 |
| Comp. Ex. 7 | $C_3F_4H_2$ | 10 | TFPy | 3 | $O_2$ | 9 | Ar | 78 | 1 |

| | Power applied [W/cm²] | Bias voltage [V] | $SiO_x$ etching rate [nm/min] | SiN etching rate [nm/min] | Resist etching rate [nm/min] | Etching rate ratio (SiN/$SiO_x$) | Etching selectivity ratio ($SiO_x$/resist) |
|---|---|---|---|---|---|---|---|
| Ex. 1 | 1.0 | 1000 | 122.3 | 179.2 | 36.3 | 1.47 | 3.37 |
| Ex. 2 | 1.0 | 1000 | 124.4 | 160.1 | 11.7 | 1.29 | 10.61 |
| Ex. 3 | 1.0 | 1000 | 120.9 | 131.7 | 7.4 | 1.09 | 16.32 |
| Ex. 4 | 1.0 | 1000 | 116.9 | 174.1 | 17.3 | 1.49 | 6.77 |
| Ex. 5 | 1.0 | 1000 | 118.1 | 133.1 | 17.1 | 1.13 | 6.91 |
| Ex. 6 | 1.0 | 1000 | 125.0 | 184.3 | 25.8 | 1.47 | 4.85 |
| Ex. 7 | 1.0 | 1000 | 135.0 | 164.1 | 36.3 | 1.22 | 3.72 |

TABLE 1-continued

| | | | | | | | |
|---|---|---|---|---|---|---|---|
| Ex. 8 | 1.0 | 1000 | 139.0 | 129.3 | 55.6 | 0.93 | 2.50 |
| Comp Ex. 1 | 1.0 | 1000 | 114.6 | 187.2 | 34.5 | 1.63 | 3.32 |
| Comp. Ex. 2 | 1.0 | 1000 | 108.6 | 177.6 | 42.2 | 1.64 | 2.57 |
| Comp. Ex. 3 | 1.0 | 1000 | 113.4 | 179.4 | 45.1 | 1.58 | 2.51 |
| Comp. Ex. 4 | 1.0 | 1000 | 115.2 | 181.2 | 48.1 | 1.57 | 2.40 |
| Comp Ex. 5 | 1.0 | 1000 | 130.1 | 115.8 | 40.1 | 0.89 | 3.24 |
| Comp. Ex. 6 | 1.0 | 1000 | 137.6 | 116.9 | 55.0 | 0.85 | 2.50 |
| Comp. Ex. 7 | 1.0 | 1000 | 92.3 | 153.1 | 3.1 | 1.66 | 49.39 |

In each of Examples where the dry etching agent contained at least 1,3,3,3-tetrafluoropropene $C_3H_2F_4$ and the unsaturated perfluorocarbon $C_xF_y$, at a mixing ratio of 1:0.1 to 10 in terms of volume ratio, the etching rate ratio of SiN to $SiO_x$ was in the range from 0.90 to less than 1.5; and the etching selectivity to resist was equal to or higher than that with no unsaturated perfluorocarbon. It has thus been shown that it is possible by this dry etching method to perform anisotropic etching of the laminated film of $SiO_x$ and SiN while suppress excessive etching of the SiN layers. Further, it is apparent from e.g. the results of Examples 6 to 8 that it is possible to control the etching rate ratio of SiN to $SiO_x$ by adjusting the mixing ratio of $C_3H_2F_4$ and the unsaturated perfluorocarbon.

In Comparative Example 1 where no unsaturated perfluorocarbon $C_xF_y$ was added, by contrast, the etching rate of SiN was too high; and the ratio of the etching rate of SiN to the etching rate of $SiO_x$ was 1.63. In Comparative Examples 2, 3 and 4 where the saturated perfluorocarbon with no double bond was used as the additive gas, the ratio of the etching rate of SiN to the etching rate of $SiO_x$ was higher than or equal to 1.5; and the etching selectivity to resist was deteriorated as compared with the case of no addition. It is considered that, in the case of using such a saturated perflurocarbon, the proportion of highly polymerizable radicals such $CF_2$ or $C_2F_4$ in the plasma becomes relatively low as the proportion of $CF_3$ radicals in the plasma becomes relatively high, whereby the protection effect of the polymer film on the SiN layers and the resist was not effectively provided due to less adhesion of the polymer film to the SiN layers and the resist. It is assumed that, when any of the etching agents of Comparative Examples 1 to 4 is applied to a laminated film of SiN layers and $SiO_x$ layers, there is a possibility of structure collapse of the laminated film by horizontal etching of the SiN layers. It is also assumed that, in the case of using any of the etching agents of Comparative Examples 2 to 4, it would be difficult to form a through hole with a high aspect ratio of 20 or higher due to deterioration in the etching selectivity to resist.

Figure 4A:
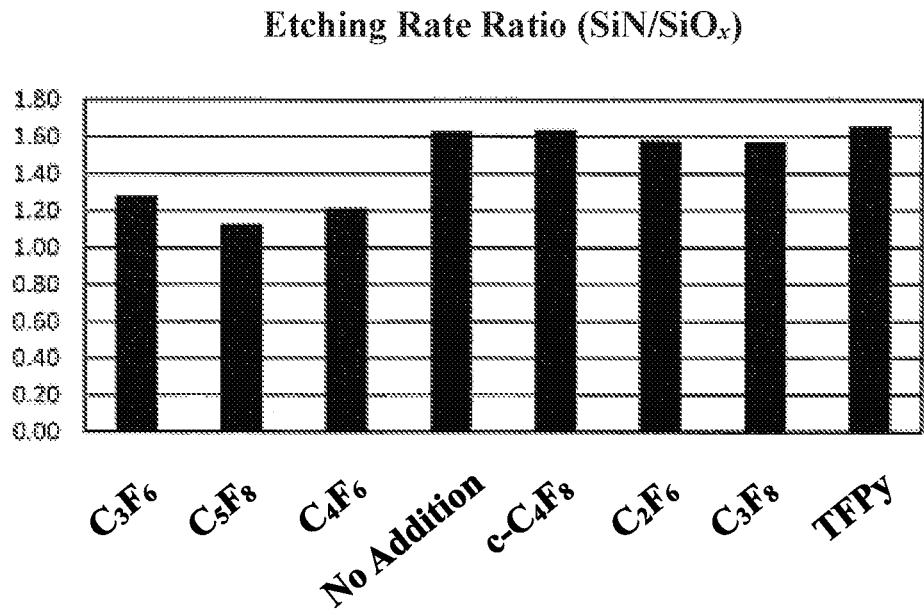
FIGS. 4A and 4B are diagrams showing SiN/SiO$_x$ etching rate ratio and etching selectivity ratio (SiO$_x$/resist) as measured in Examples 2, 5 and 7 and Comparative Examples 1, 2, 3, 4 and 7.
Figure 4B:
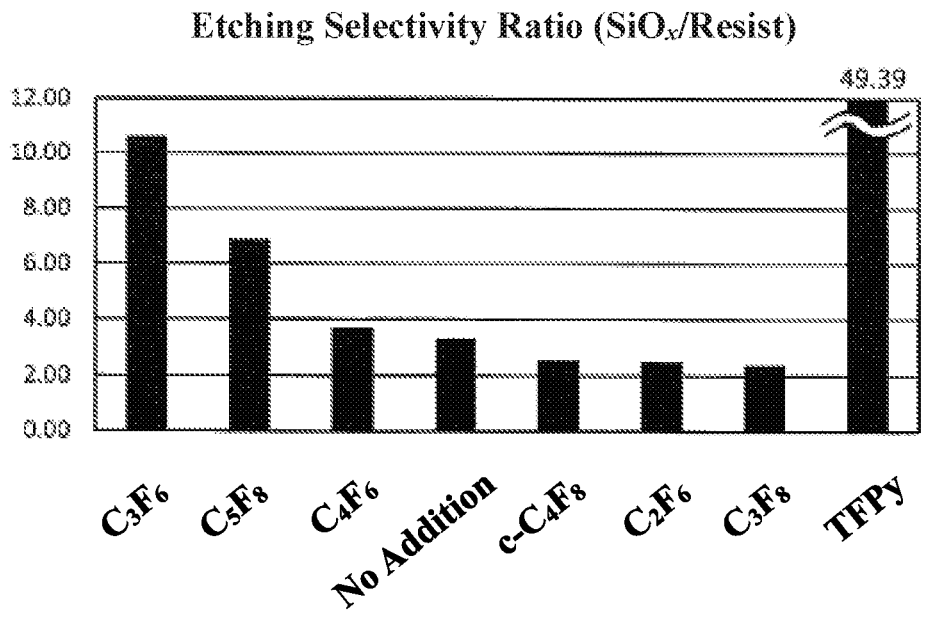

FIGS. 4(a) and (b) are diagrams showing the measurement results of the $SiN/SiO_x$ etching rate ratio and etching selectivity ratio ($SiO_x$/resist) in Comparative Example 1 where no additive gas was used and in Examples 2, 5 and 7 and Comparative Examples 2, 3, 4 and 7 where different kinds of additive gases were used in an amount of 3 vol %. As shown in FIG. 4(a), the $SiN/SiO_x$ etching rate ratio was lowered with the addition of the double bond-containing unsaturated perfluorocarbon such as $C_3F_6$, $C_5F_8$ or $C_4F_6$ as compared with the case of no addition. Even when the double bond-free saturated perfluorocarbon such as c-$C_4F_8$, $C_2F_6$ or $C_3F_8$ or TFPy having not only a triple bond but also a hydrogen atom was added, the $SiN/SiO_x$ etching rate ratio was substantially equivalent to that with no additive gas. As shown in FIG. 4(b), the etching selectivity ratio ($SiO_x$/resist) was remarkably improved with the addition of the double bond-containing unsaturated perfluorocarbon $C_3F_6$, $C_5F_8$ as compared with the case of no addition. Some improvement of the etching selectively ratio was seen when $C_4F_6$ was added. When the double bond-free saturated perfluorocarbon c-$C_4F_8$, $C_2F_6$, $C_3F_8$ was added, however, the etching selectively ratio was rather lowered as compared with the case of no addition. The etching selectivity ratio was significantly improved with the addition of TFPy having not only a triple bond but also a hydrogen atom.

As verified above, the saturated perfluorocarbon did not effectively provide the protection effect due to less adhesion of the protection film to the SiN layers and the resist. On the other hand, the fluorocarbon with a double bond or triple bond were polymerized in the plasma to form the protection film and thereby suppress etching of SiN and the resist. The hydrogen-containing fluorocarbon (such as $C_3F_4H_2$ as main etching gas component, or TFPy) did not suppress the etching rate of SiN by generation of a larger amount of active SiN-etching species. It has thus been shown that the hydrogen-free unsaturated perfluorocarbon is effective as the additive gas to suppress the etching rate of SiN in addition to further improving the etching selectivity to resist.

In Comparative Example 5, the unsaturated perfluorocarbon represented by $C_xH_y$ was added at a volume ratio exceeding 10 relative to $C_3H_2F_4$. Consequently, the etching rate of SiN became too low. The ratio between the etching rate of SiN and the etching rate of $SiO_x$ was thus lowered to 0.89. The etching selectivity to resist was also deteriorated as compared with the case where no unsaturated perfluorocarbon was added.

In Comparative Example 6, only the unsaturated perfluorocarbon $C_3H_6$ was used. As a result, the etching rate of SiN was low. The ratio between the etching rate of SiN and the etching rate of $SiO_x$ was thus lowered to 0.85. It is assumed from this result that, even when the etching agent of Comparative Example 6 is applied to a laminated film of SiN layers and $SiO_x$ layers, it would not be possible to form a through hole in the laminated film due to deposition of gas-derived deposits on the SiN layers.

In Comparative Example 7, TFPy having a hydrogen atom and a triple bond was added. Although the $SiO_x$/resist etching selectivity was considerably improved, the $SiN/SiO_x$ etching rate ratio was not much changed from that of Comparative Example 1. It is assumed from this result that the protection film derived from TFPy was mainly formed on the resist and was not almost formed on the SiN layers.

INDUSTRIAL APPLICABILITY

The dry etching method according to the present invention is useful for the formation of wiring in three-dimensionally integrated NAND flash memories etc. during semiconductor manufacturing processes.

DESCRIPTION OF REFERENCE NUMERALS

1: SiN layer
2: $SiO_x$ layer
3: Mask
4: Substrate
5: Through hole
10: Reaction apparatus
11: Chamber
12: Pressure gauge
13: High-frequency power source
14: Lower electrode
15: Upper electrode
16: Gas introduction hole
17: Exhaust line
18: Sample

The invention claimed is:

1. A dry etching method for etching a laminated film of silicon oxide layers and silicon nitride layers on a substrate, the dry etching method comprising providing a mask with a predetermined opening pattern on the laminated film, generating a plasma from a dry etching agent and etching the laminated film by the plasma through the mask under a negative direct-current self-bias voltage of −500V or lower to form a through hole in the laminated film in a direction vertical to the silicon oxide layers and the silicon nitride layers,
wherein the dry etching agent contains at least $C_3H_2F_4$, an unsaturated perfluorocarbon represented by $C_xF_y$ (where x is an integer of 2 to 5; y is 2, 4, 6, 8 or 10; and x and y satisfy y≤2x), and an oxidizing gas,
wherein a volume of the unsaturated perfluorocarbon contained in the dry etching agent is 0.1 to 10 times a volume of the $C_3H_2F_4$ contained in the dry etching agent, and
wherein the ratio of an etching rate of the silicon nitride layers to an etching rate of the silicon oxide layers is in a range from 0.90 to less than 1.5.

2. The dry etching method according to claim 1, wherein the unsaturated perfluorocarbon is at least one selected from the group consisting of $C_3F_6$, $C_4F_6$, $C_4F_8$ and $C_5F_8$.

3. The dry etching method according to claim 1, wherein a total concentration of the unsaturated perfluorocarbon and the $C_3H_2F_4$ in the dry etching agent is 5 volume % or more.

4. The dry etching method according to claim 1, wherein the oxidizing gas is at least one selected from the group consisting of $O_2$, $O_3$, CO, $CO_2$, $COCl_2$, $COF_2$ and $NO_2$.

5. The dry etching method according to claim 1, further comprising an inert gas,
wherein the inert gas is at least one selected from the group consisting of He, Ne, Ar, Kr, Xe and $N_2$.

6. The dry etching method according to claim 5,
wherein the dry etching agent consists only of the $C_3H_2F_4$, the unsaturated perfluorocarbon, the oxidizing gas and the inert gas.

7. The dry etching method according to claim 1,
wherein the $C_3H_2F_4$ is 1,3,3,3-tetrafluoropropene.

8. The dry etching method according to claim 1,
wherein the mask is formed of amorphous carbon.

9. The dry etching method according to claim 1,
wherein an amount of the unsaturated perfluorocarbon in the dry etching agent is set larger during a latter half of the formation of the through hole than during a former half of the formation of the through hole.

10. The dry etching method according to claim 1,
wherein an amount of the unsaturated perfluorocarbon in the dry etching agent is set larger during etching of the silicon oxide layers than during etching of the silicon nitride layers.

11. The dry etching method according to claim 1,
wherein a depth of the through hole is 0.5 μm or more.

12. The dry etching method according to claim 1,
wherein an aspect ratio obtained by dividing a depth of the through hole by an opening width of the mask is 20 or higher.

13. The dry etching method according to claim 1,
wherein the silicon oxide layers and the silicon nitride layers are alternately laminated on the substrate, and the total number of the silicon oxide layers and the silicon nitride layers in the laminated film is 6 or more.

14. The dry etching method according to claim 13,
wherein the total number of the silicon oxide layers and the silicon nitride layers in the laminated film is 32 or more.

15. The dry etching method according to claim 1,
wherein the ratio of an etching rate of the silicon oxide layers to an etching rate of the mask is 2.5 or more.

16. The dry etching method according to claim 5,
wherein the $C_3H_2F_4$ is 1,3,3,3-tetrafluoropropene;
wherein the unsaturated perfluorocarbon is at least one selected from the group consisting of $C_3F_6$, $C_4F_6$, $C_4F_8$ and $C_5F_8$;
wherein the inert gas is Ar; and
wherein the oxidizing gas is $O_2$.

17. The dry etching method according to claim 16,
wherein the dry etching agent consists of the $C_3H_2F_4$, the unsaturated perfluorocarbon, the inert gas and the oxidizing gas.

18. A dry etching method for etching a laminated film of silicon oxide layers and silicon nitride layers on a substrate, the dry etching method comprising providing a mask with a predetermined opening pattern on the laminated film, generating a plasma from a dry etching agent and etching the laminated film by the plasma through the mask under a negative direct-current self-bias voltage of −500V or lower to form a through hole in the laminated film in a direction vertical to the silicon oxide layers and the silicon nitride layers,
wherein the dry etching method includes:
a first dry etching step during a former half of the formation of the through hole with the supply of a first dry etching agent containing $C_3H_2F_4$ and an oxidizing gas and substantially free of an unsaturated perfluorocarbon represented by $C_xF_y$ (where x is an integer of 2 to 5; y is 2, 4, 6, 8 or 10; and x and y satisfy y≤2x), and a second dry etching step during a latter half of the formation of the through hole with the supply of a second dry etching agent containing $C_3H_2F_4$, an unsaturated perfluorocarbon represented by $C_xF_y$ (where x is an integer of 2 to 5; y is 2, 4, 6, 8 or 10; and x and y satisfy y≤2x), and an oxidizing gas, wherein a volume of the unsaturated perfluorocarbon contained in the second dry etching agent is 0.1 to 10 times a volume of the $C_3H_2F_4$ contained in the second dry etching agent, and wherein the ratio of an etching rate of the silicon nitride layers in the second dry etching step to an etching rate of the silicon oxide layers in the second dry etching step is in a range from 0.90 to less than 1.5.

19. A dry etching method for etching a laminated film of silicon oxide layers and silicon nitride layers on a substrate, the dry etching method comprising providing a mask with a predetermined opening pattern on the laminated film, generating a plasma from a dry etching agent and etching the laminated film by the plasma through the mask under a negative direct-current self-bias voltage of −500V or lower to form a through hole in the laminated film in a direction vertical to the silicon oxide layers and the silicon nitride layers, wherein the dry etching method includes:

a first dry etching step of etching the silicon nitride layers with the supply of a first dry etching agent containing $C_3H_2F_4$ and an oxidizing gas and substantially free of an unsaturated perfluorocarbon represented by $C_xF_y$ (where x is an integer of 2 to 5; y is 2, 4, 6, 8 or 10; and x and y satisfy y≤2x), and a second dry etching step of etching the silicon oxide layers with the supply of a second dry etching agent containing $C_3H_2F_4$, an unsaturated perfluorocarbon represented by $C_xF_y$ (where x is an integer of 2 to 5; y is 2, 4, 6, 8 or 10; and x and y satisfy y≤2x), and an oxidizing gas, wherein a volume of the unsaturated perfluorocarbon contained in the second dry etching agent is 0.1 to 10 times a volume of the $C_3H_2F_4$ contained in the second dry etching agent, and wherein the ratio of an etching rate of the silicon nitride layers in the second dry etching step to an etching rate of the silicon oxide layers in the second dry etching step is in a range from 0.90 to less than 1.5.

* * * * *